United States Patent [19]

Burke et al.

[11] 3,873,858

[45] Mar. 25, 1975

[54] ACOUSTIC SURFACE WAVE PHASE SHIFTER

[75] Inventors: Barry Ernest Burke, Newton; Ernest Stern, Concord; Abraham Bers, Arlington, all of Mass.

[73] Assignee: Massachusetts Institute of Technology, Cambridge, Mass.

[22] Filed: May 23, 1972

[21] Appl. No.: 255,997

[52] U.S. Cl. .................... 310/8.1, 310/9.1, 330/5.5, 333/30 R

[51] Int. Cl. .............................................. H01v 7/00

[58] Field of Search .................. 310/8, 8.1, 9.8, 9.7; 330/5.5; 333/30 R, 72

[56] References Cited

UNITED STATES PATENTS

| | | | |
|---|---|---|---|
| 3,388,334 | 6/1968 | Adler | 330/5.5 |
| 3,582,540 | 6/1971 | Adler | 330/5.5 X |
| 3,675,140 | 7/1972 | Fang et al. | 333/5.5 |
| 3,679,985 | 7/1972 | Fang et al. | 333/5.5 X |
| 3,686,579 | 8/1972 | Everett | 330/5.5 |
| 3,699,482 | 10/1972 | Ash | 333/30 R |
| 3,710,465 | 1/1973 | Thomann | 333/30 R |

OTHER PUBLICATIONS

Tapping Microwave Acoustics for Better Signal Processing by Collins et al., Electronics, Nov. 10, 1969, pp. 94–103.

Surface Elastic Waves, White, Proceedings of IEEE, Vol. 58, No. 8, Aug. 1970, pp. 1238–1276.

Acoustic Surface Wave Amplification Using An Accumulation Layer on Silicon, Proccedings of IEEE, Vol. 50, No. 10, Oct. 1970, pp. 1775, 1776.

*Primary Examiner*—Mark O. Budd
*Attorney, Agent, or Firm*—Arthur A. Smith, Jr.; Joseph S. Iandiorio; Martin M. Santa

[57] ABSTRACT

An acoustic surface wave phase shifter including a piezoelectric medium for propagating a surface wave and a conducting device disposed proximate a surface of the piezoelectric medium on which a surface wave propagates, and means for controlling the interaction of the conducting device with the electric field associated with a surface wave for shifting the phase of a surface wave.

12 Claims, 8 Drawing Figures

ACOUSTIC SURFACE WAVE PHASE SHIFTER

FIELD OF INVENTION

This invention relates to an acoustic surface wave phase shifter and more particularly to an apparatus which controls the interaction of a conducting device with the electric field associated with an acoustic surface wave for controlling the phase of that surface wave.

BACKGROUND OF INVENTION

Elastic waves and particularly surface acoustic waves propagate in solids at speeds which are typically $10^5$ times slower than electromagnetic waves. The slower speed of these waves makes them suitable for use in delaying functions such as could be implemented by delay lines; a delay of several microseconds may be achieved in a centimeter of acoustic delay line whereas a similar electromagnetic delay line would require a kilometer. This technology has continued to expand and is known by many as microsound, a name inspired by the field of microwave technology which is analagous in many ways. More background in microsound technology may be gained from the Special Issue on Microwave Acoustics, IEEE Transactions on Microwave Theory and Techniques, November 1969, Volume MTT, Number 11.

In a number of applications it is desirable to have an acoustic surface wave phase shifter, especially a variable phaser. For example, since the velocity of a surface wave varies with temperature and since the dimensions of a delay line also vary with temperature, the delay intorduced by a delay line is subject to variance with temperature. One method of correcting for this variance is to control the phase of the propagating wave to permit it to be shifted as required to compensate for the change in velocity and dimension.

SUMMARY OF INVENTION

It is therefore an object of this invention to provide a variable phaser for shifting the phase of a surface wave.

It is a further object of this invention to provide a phaser capable of shifting the phase of a surface wave by controlling the interaction of a conducting device with the electric field associated with the surface wave.

It is a further object of this invention to provide such a phaser which interacts with the electric field of a surface wave by shunting or short circuiting that field to reduce the velocity of the wave.

It is a further object of this invention to provide a remanent variable phaser for surface waves.

This invention features an acoustic surface wave phase shifter including a piezoelectric medium for propagating a surface wave, a conducting device disposed proximate a surface of the piezoelectric medium on which a surface wave propagates for interacting with the electric field associated with a surface wave for shifting the phase of a surface wave, and means for varying the interaction of the conducting device with the electric field associated with a surface wave for controlling the phase of a surface wave.

In one embodiment the conducting device includes a semiconductor medium disposed proximate the surface of the piezoelectric medium on which a surface wave propagates and the means for varying includes, transverse to the semiconductor surface, an electric field whose intensity may be varied to include a layer of free charges and vary the interaction of the charge layer with the electric field associated with the surface wave to control the shunting effect of the charge layer and shift the phase of the surface wave.

In another embodiment the conducting device includes a conductor layer proximate the surface of the piezoelectric medium on which a surface wave propagates and the means for varying include a second piezoelectric medium, proximate the surface of the first piezoelectric medium on which a surface wave propagates, for supporting the conductor layer, means for mounting the second piezoelectric medium in fixed relation to the first and means for applying an electric field across the second piezoelectric medium to produce a strain in that second piezoelectric medium which changes a dimension of that second medium and thereby changes the distance between the conductor layer and first piezoelectric medium to vary the interaction of the conductor layer with the electric field associated with the surface wave and thereby control the velocity of the surface wave and its phase shift.

DISCLOSURE OF PREFERRED EMBODIMENT

Other objects, features, and advantages will occur from the following description of a preferred embodiment and the accompanying drawings, in which.

When a surface wave moves in a piezoelectric medium there is an electric field associated with that wave. This invention may be accomplished by utilizing a conducting device such as a layer of free charges or a conductor plane to interact with the electric field associated with the surface wave to vary the velocity of that wave and thereby function as a phase shifter.

Figure 1:
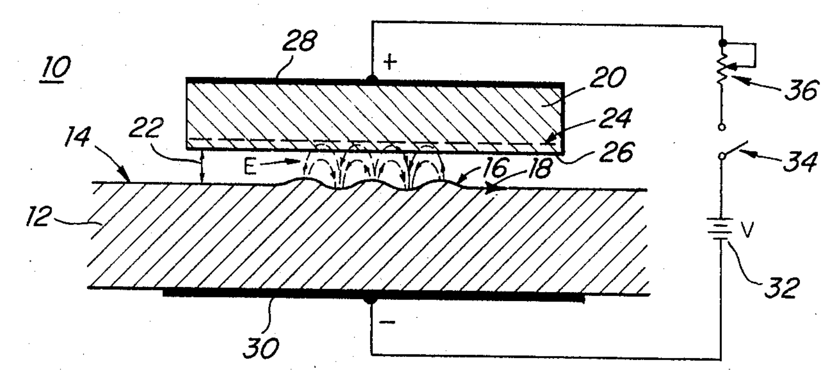
FIG. 1 is a schematic diagram of a field effect surface wave phase shifter according to this invention.

There is shown in FIG. 1 a field effect surface wave phaser or phase shifter 10 including a piezoelectric medium 12 having a surface 14 on which a surface wave 16 may propagate in the direction shown by arrowhead 18. The electric field associated with surface wave 16 is shown in part at E. A high resistivity semiconductor medium 20 proximate piezoelectric medium 12 is spaced from surface 14 by a gap 22 typically less than an acoustic wave length in width. Semiconductor medium 20 is provided, in a manner described below, with a free charge layer 24 near its surface 26 proximate surface 14. Layer 24 interacts with electric field E and produces a shunting or shorting effect on field E, which has the effect of reducing the velocity of surface wave 16 and thereby effecting a phase shift thereof. The amount of interaction or "shorting" effect of layer 24 with the field E is controlled to effect a desired phase shift by means of a transverse electric field applied across semiconductor medium 20 and layer 24. A workable device is obtained using a semiconductor having a resistivity of 10,000 ohms-centimeter.

In FIG. 1 this is accomplished by means of electrode 28 mounted on the top of semiconductor medium 20 and electrode 30 mounted on the bottom of piezoelectric medium 12. Electrodes 28 and 30 are connected to a voltage source 32, having a value V, through a switch 34 and variable resistance or potentiometer 36. In operation, the electric field transverse to the semiconductor medium 20 provided by electrodes 28 and 30 can be applied either to increase or decrease the density of the charges in layer 24 near the surface 26. By varying this field between electrodes 28 and 30 the carrier density in layer 24 at surface 26 can be varied over a wide range. Since the velocity of surface wave 16 on surface 14 of piezoelectric medium 12 decreases if the piezoelectric field is short circuited, it follows that the phase shift of surface wave 16 through phase shifter 10 can be altered by varying the voltage applied to electrodes 28 and 30 by means of voltage source 32, switch 34 and potentiometer 36 for example.

In a preferred embodiment piezoelectric medium 12 may be made of any suitable piezoelectric substance such as lithium niobate and semiconductor medium 20 may be made of any suitable semiconductor such as silicon. Typically, silicon semiconductor 20 is heated to form a layer of silicon dioxide at surface 26 to eliminate traps which would reduce the effectiveness of layer 24; layer 24 may be either a free electron layer or a free hold layer and voltage source 32 may be connected in the circuit either with the polarity shown in FIG. 1 or with the opposite polarity.

Figure 2:
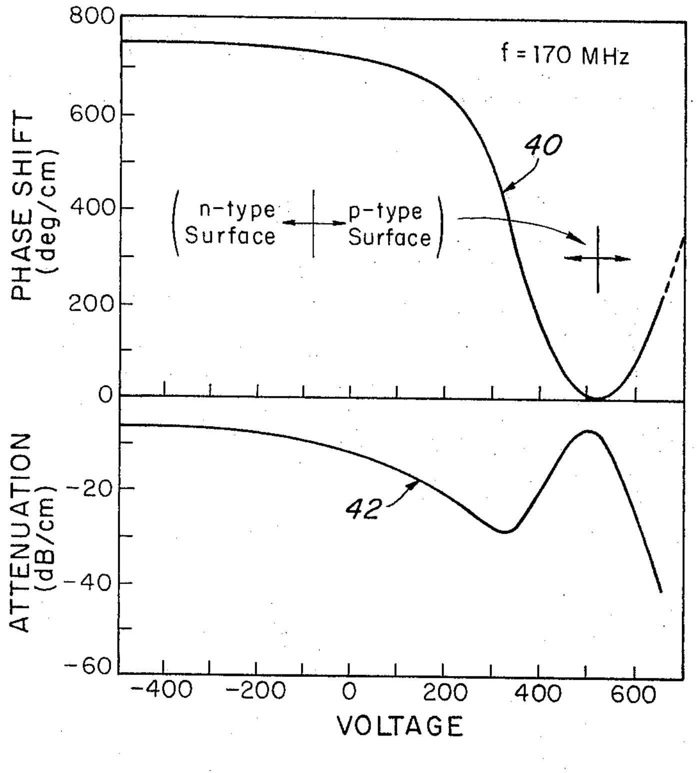
FIG. 2 is a graph showing the relation between the phase shift and voltage and between the attenuation and voltage for the phase shifter shown in FIG. 1.

A characteristic response of phase shifter 10 at 170 MHz, FIG. 1, in terms of the phase shift and the attenuation produced by variation of the voltage applied to electrodes 28 and 30 is shown in the composite graph in FIG. 2. The phase shift characteristic 40 as shown in the top portion of the graph of FIG. 2 indicates that the phase shift varies from a value of approximately 760° per centimeter at minus 500 volts to 0° per centimeter at approximately plus 510 volts. The phase shift remains fairly constant from minus 500 volts through approximately plus 200 volts. In this region the voltage V has induced a high density of free electrons in layer 24. Then as the charge in the free charge layer 24 begins to be diminished by the increased positive voltage the phase shift begins to drop off until finally at plus 510 volts the charge in the free charge layer 24 is zero and there is no shorting effect produced on the electric field E, thus no reduction in velocity of surface wave 16 and no phase shift. A voltage of 510 volts between electrodes 28 and 30 was required in this instance to reduce the charge layer 24 to zero because of the presence of bound positive charges in the silicon dioxide on surface 26. The effect of these bound positive charges is to shift characteristics 40 and 42 to the right with respect to the voltage axis. As the voltage is further increased above plus 510 volts the characteristic 40 begins to repeat itself in a similar manner. The path that characteristic 40 follows from minus 500 volts through 0 to plus 510 volts represents the response of a free electron layer such as shown in a device in FIG. 1. The response of a free hole layer for voltages above 510 volts can be obtained qualitatively by following characteristic 40 starting at plus 510 volts through 0 to minus 500 volts, i.e., from right to left in FIG. 2.

Similarly, characteristic 42 which indicates the attenuation of surface wave 16 with variation in voltage indicates that the attenuation at minus 500 volts is approximately minus 8 decibels per centimeter and then increases gradually as the voltage passes through zero and moves toward plus 300 volts where the attenuation reaches a value of approximately 25 decibels per centimeter. Further increase in voltage in the positive direction results in a decrease in attenuation until at approximately plus 510 volts the attenuation dips to a minimum of minus 5 decibels per centimeter where the charge in layer 24 is reduced to zero by the voltage applied across electrodes 28 and 30. In many applications it may be desirable to obtain a predetermined phase shift with minimum attentuation. In those cases the voltage can be set for minimum attenuation i.e., +500 or −500 in FIG. 2. Then, since phase shift is linearly proportioned to interaction length the desired phase shift can then be obtained by adjusting the interaction length of the device.

Figure 3:
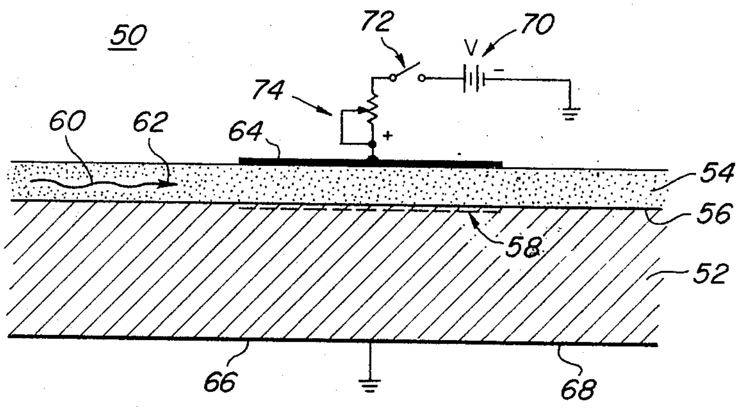
FIG. 3 is a schematic diagram of a field effect surface wave phase shifter similar to that shown in FIG. 1 which is integrally formed.

The invention may also be accomplished with a field effect surface wave phase shifter in which the piezoelectric medium in which the surface wave propagates and the semiconductor medium which contains the free charge layer are included in one integral structure such as shown in phase shifter 50, FIG. 3. Phase shifter 50 includes a semiconductor medium 52 which may be made out of a substance such as high-resistivity silicon, for example, and an integral piezoelectric film 54 deposited on the surface 56 of semiconductor medium 52 proximate free charge layer 58. Piezoelectric medium 54 may be, for example, a film of zinc oxide. Surface wave 60 propagates in the piezoelectric medium 54 in the direction shown by arrowhead 62. The shorting effect of layer 58 may be varied in the same manner as explained with reference to phase shifter 10 in FIG. 1 by applying a transverse electric field across semiconductor medium 52. In phase shifter 50 this is done by means of electrode 64 mounted on piezoelectric medium 54 and a second electrode 66 which may in effect be the lower surface 68 of semiconductor medium 52. The transverse electric field provided between electrodes 64 and 66 is supplied by voltage source 70 in series with the switch 72 and potentiometer 74.

Figure 4:
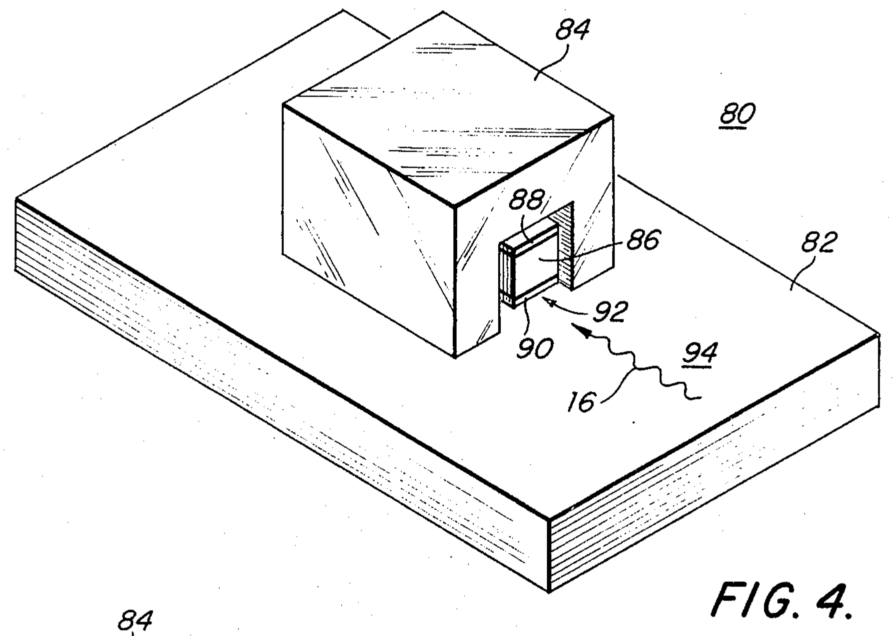
FIG. 4 is an axonometric diagrammatic view of an electromechanical surface wave phase shifter according to this invention.
Figure 5:
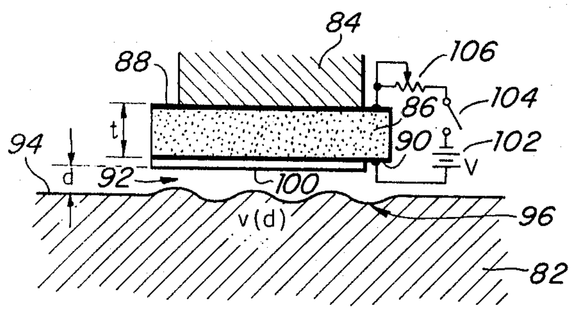
FIG. 5 is a schematic diagram of a portion of the phase shifter shown in FIG. 4.

A second technique according to this invention for providing phase shifting of surface waves by using interaction with the electric field associated with the surface wave to reduce the velocity of the surface wave is shown in FIGS. 4 and 5. In FIGS. 1 and 3 a free charge layer was controlled by means of a transverse electric field to interact with the electric field. associated with a surface wave and reduce the velocity of the surface wave by producing a shorting effect on that associated electric field to produce a phase shift. In contrast in FIGS. 4 and 5 the phase shifter 80 operates to move a conductor plane toward and away from the electric field associated with the surface wave to produce a phase shift. In FIG. 4 phase shifter 80 includes a piezoelectric medium 82, on which the surface wave propagates, and a rigid mount 84 supported thereon.

Second piezoelectric medium 86 positioned between a pair of electrodes 88 and 90 is supported by rigid mount 84 in spaced relation to piezoelectric medium 82 so that a gap 92 exists between lower electrode 90 and the surface 94 on which a surface wave propagates. A conductor plane 100 which may be a metallized layer or metallic film is connected to the lower portion of piezoelectric medium 86. Conductor plane 100 may be fastened directly to electrode 90 or may be mounted electrically insulated therefrom or may be one and the same with electrode 90 so that a single element functions as both electrode and conductor plane. The thickness t of piezoelectric medium 86 may be varied by varying the electric field applied across it provided by voltage source 102 through switch 104 and potentiometer 106. Variation in the thickness t of piezoelectric medium 86 results in a similar variation in the width d of gap 92 whereby conductor plane 100 is moved toward and away from surface 94 on which surface wave 96 propagates. In this manner the shorting effect of conductor plane 100 on the electrical field associated with surface wave 96 may be varied to effect a controlled change in the velocity of surface wave 96 and effect a phase shift. Typically, piezoelectric medium 82 may be a substance such as lithium niobate and piezoelectric medium 86 may be a substance such as lead zirconate titanate or PZT. The distance d is generally designed to be less than an acoustic wavelength and the thickness t is typically one millimeter.

Figure 6:
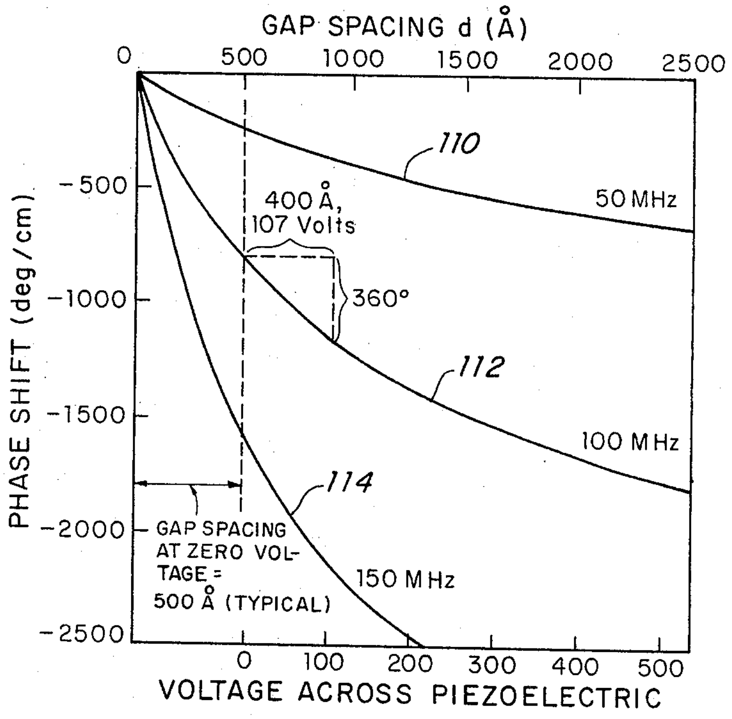
FIG. 6 is a graph showing the relationship between phase shift and voltage for the phase shifter of FIG. 4.

The phase shift obtainable with phase shifter 80, FIGS. 4 and 5 is shown by the graph in FIG. 6 for surface waves of 50, 100 and 150 MHz frequency by characteristics 110, 112 and 114, respectively. Characteristics 110, 112 and 114 were calculated for a substance known as PZT–5 for the piezoelectric medium 86 and lithium niobate for piezoelectric medium 82. The substance PZT–5 is obtainable from Clevite Corporation and is a chemical composition known generically by the name lead zirconate titanate.

Characteristics 110, 112 and 114 indicate that phase shifter 80 is more responsive to changes in voltage for surface waves of higher frequency for gap spacings much less than an acoustic wavelength. Generally, increasing the voltage across piezoelectric medium 86 increases the change in gap spacing d and thereby increases the phase shift as well. Typically, for a surface wave having a frequency of 100 MHz as represented by characteristic 112, an increment of 107 volts which provides a change in the gap width d from 500A to 900A provides a change of 360° in the phase shift.

Figure 7:
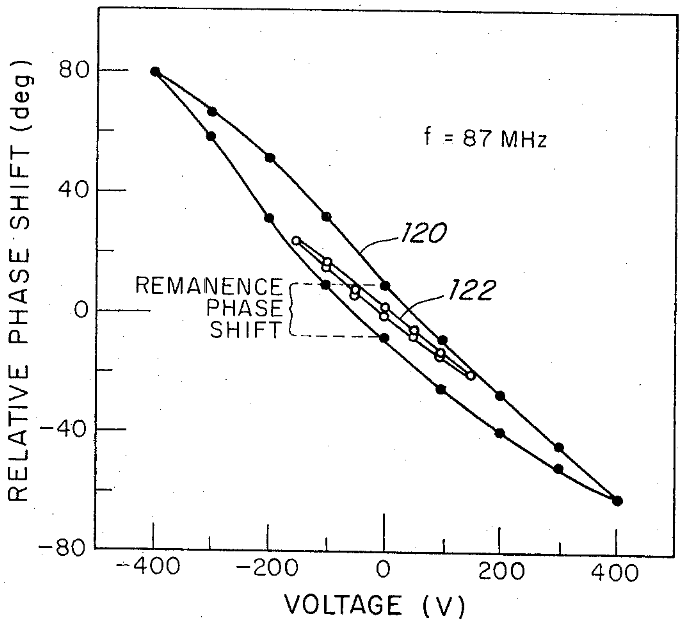
FIG. 7 is a graph showing the relationship of relative phase shifter to voltage for the surface wave phase shifter of FIG. 4, and indicating some hysteresis effect.
Figure 8:
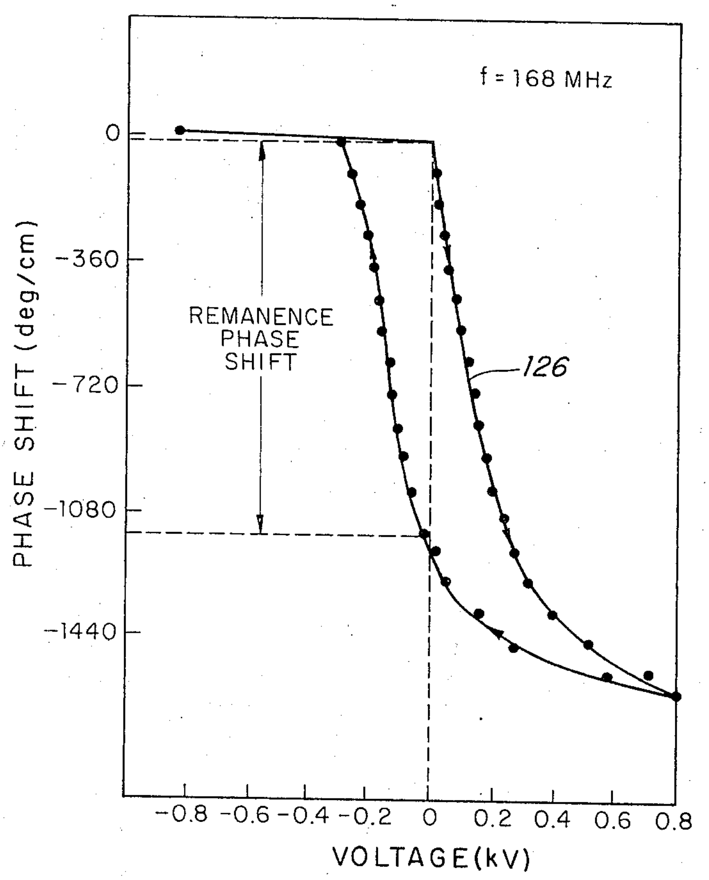
FIG. 8 is a graph similar to that of FIG. 7 showing more pronounced hysteresis effect.

A remanent surface wave phase shifter may be made using the phase shifter 80 illustrated in FIGS. 4 and 5 by utilizing the hysteresis effect of the piezoelectric medium 86 used to provide the movement of conductor plane 100. Thus in FIG. 7 there are shown two characteristics 120 and 122 which illustrate the hysteresis effect in phase shifter 80 when using a piezoelectric medium 86 such as PZT, which is also ferroelectric, a piezoelectric medium 82 such as lithium niobate and a rigid mount 84 such as fuzed quartz to shift the phase of a surface wave whose frequency is 87 MHz. For example, at 0 volts characteristic 120 indicates that the hysteresis effect of the PZT used in medium 86 results in a remanent relative phase shift of approximately 20°. This hysteresis effect is a result of the ferroelectric property of the PZT. A fixed dipole moment and hence a fixed component of strain remains in the PZT when the applied voltage is returned to zero. Thus phase shifter 80 may be made to exhibit a remanent phase shift by using a substance for piezoelectric medium 86 which is both a piezoelectric medium and a ferroelectric medium. A phase shifter which exhibits a remanent phase shift is of interest because a residual phase shift is obtainable even without a sustained voltage. The hysteresis loops may be made more square and hence increase the remanent phase shift by using materials having better dielectric properties in the structure of phase shifter 80. For example, by using PZT in place of fuzed quartz for the rigid mount 84 a much more pronounced hysteresis effect and remanent phase shift may be obtained as shown in the graph of FIG. 8 by characteristic 126. In FIG. 8 the remanent phase shift was observed to be over 1,000° per centimeter for a surface wave having a frequency of 168 MHz.

Other embodiments will occur to those skilled in the art and are within the following claims:

What is claimed is:

1. An acoustic surface wave phase shifter comprising:
a first piezoelectric medium for propagating a surface wave;
a second piezoelectric medium proximate a surface of said first piezoelectric medium on which a surface wave propagates;
a conductor layer on a portion of said second piezoelectric medium proximate the surface of said first piezoelectric medium on which a surface wave propagates;
means for mounting said second piezoelectric medium in fixed relation to said first piezoelectric medium; and
means for applying an electric field across said second piezoelectric medium to produce a strain in said second piezoelectric medium which changes a dimension of that second piezoelectric medium and changes the distance between said conductor layer and said first piezoelectric medium for shifting the phase of a surface wave.

2. The surface wave phase shifter of claim 1 in which said conductor layer and said second piezoelectric medium are spaced from each other.

3. The acoustic surface wave phase shifter of claim 2 in which said conductor layer and said second piezoelectric medium are spaced by a distance of less than one wavelength.

4. The acoustic surface wave phase shifter of claim 1 in which said means for applying an electric field includes said conductor layer.

5. The acoustic surface wave phase shifter of claim 1 in which said second piezoelectric medium is a ferroelectric substance.

6. The acoustic surface wave phase shifter of claim 5 in which said second piezoelectric medium is lead zirconate titanate.

7. The acoustic surface wave phase shifter of claim 5 in which said means for mounting and said first medium are substances having high dielectric constants.

8. The acoustic surface wave phase shifter of claim 7 in which said means for mounting is lead zirconate titanate.

9. The acoustic surface wave phase shifter of claim 1 in which said means for mounting is fuzed quartz.

10. The acoustic surface wave phase shifter of claim 1 in which said first piezoelectric medium is lithium niobate.

11. A remanent acoustic surface wave phase shifter comprising:

a first piezoelectric medium for propagating an acoustic surface wave;

a second ferroelectric piezoelectric medium proximate a surface of said first piezoelectric medium on which an acoustic surface wave propagates;

a conductor layer on a portion of said second piezoelectric medium proximate the surface of said first piezoelectric medium on which an acoustic surface wave propagates;

means for mounting said second piezoelectric medium in fixed relation to said first piezoelectric medium; and means for applying an electric field across said second piezoelectric medium to produce a strain in said second piezoelectric medium which changes a dimension of that second piezoelectric medium and changes the distance between said conductor layer and said first piezoelectric medium for shifting a phase of the surface wave.

12. The remanent acoustic surface wave phase shifter of claim 11 in which said first medium and said means for mounting have high dielectric constants.

* * * * *

UNITED STATES PATENT OFFICE
CERTIFICATE OF CORRECTION

Patent No. 3,873,858 Dated March 25, 1975

Inventor(s) Barry E. Burke, Ernest Stern and Abraham Bers

It is certified that error appears in the above-identified patent and that said Letters Patent are hereby corrected as shown below:

Insert as the second paragraph in the section entitled "ABSTRACT":

--The invention herein described was made in the course of work performed under a contract with the Electronic Systems Division, Air Force Systems Command, United States Air Force.--

Signed and sealed this 27th day of May 1975.

(SEAL)
Attest:

RUTH C. MASON
Attesting Officer

C. MARSHALL DANN
Commissioner of Patents
and Trademarks